(12) United States Patent
Pappas et al.

(10) Patent No.: US 10,580,352 B2
(45) Date of Patent: Mar. 3, 2020

(54) TESTING OF MICRO LIGHT EMITTING DIODES (LEDS) USING PROBE PADS

(71) Applicant: Facebook Technologies, LLC, Menlo Park, CA (US)

(72) Inventors: Ilias Pappas, Cork (IE); William Thomas Blank, Bellevue, WA (US)

(73) Assignee: Facebook Technologies, LLC, Menlo Park, CA (US)

(*) Notice: Subject to any disclaimer, the term of this patent is extended or adjusted under 35 U.S.C. 154(b) by 0 days.

(21) Appl. No.: 16/184,959

(22) Filed: Nov. 8, 2018

(65) Prior Publication Data

US 2020/0013318 A1    Jan. 9, 2020

(30) Foreign Application Priority Data

Jul. 3, 2018    (GR) .............................. 20180100297

(51) Int. Cl.
*G09G 3/00* (2006.01)
*H01L 25/16* (2006.01)
(Continued)

(52) U.S. Cl.
CPC ........... *G09G 3/32* (2013.01); *G01R 31/2635* (2013.01); *G01R 31/275* (2013.01);
(Continued)

(58) Field of Classification Search
CPC ............. G09G 3/32; G09G 2300/0426; G09G 2330/12; H01L 22/24; H01L 23/34;
(Continued)

(56) References Cited

U.S. PATENT DOCUMENTS

2009/0109142 A1* 4/2009 Takahara ............... G09G 3/006
345/76
2009/0160743 A1   6/2009 Tomida et al.
(Continued)

FOREIGN PATENT DOCUMENTS

CN        102194392 A    9/2011
CN        104821144 A    8/2015
(Continued)

OTHER PUBLICATIONS

PCT International Search Report and Written Opinion, PCT Application No. PCT/US2018/061101, dated Apr. 1, 2019, 14 pages.
(Continued)

*Primary Examiner* — Andrew Sasinowski
(74) *Attorney, Agent, or Firm* — Fenwick & West LLP

(57) ABSTRACT

Embodiments relate to testing a plurality of LEDs by applying a voltage difference between anode electrodes and cathode electrodes of the plurality of LEDs using transistors and probe pads on a display substrate. The anode electrodes of the plurality of LEDs are connected to a first probe pad via clamping transistors, and the cathode electrodes are connected to a second probe pad. Responsive to applying the voltage difference, it is determined whether the plurality of LEDs satisfy a threshold level of operability. The display substrate also includes driving transistors and switching transistors connected to the plurality of LEDs, the driving transistors and switching transistors used during operating mode.

20 Claims, 7 Drawing Sheets

(51) Int. Cl.
*G09G 3/32* (2016.01)
*G01N 21/95* (2006.01)
*G01R 31/27* (2006.01)
*H01L 25/075* (2006.01)
*H01L 21/78* (2006.01)
*G01R 31/26* (2020.01)
*H01L 21/66* (2006.01)
*H01L 23/34* (2006.01)
*H01L 21/60* (2006.01)
*H01L 33/30* (2010.01)
*H01L 33/32* (2010.01)

(52) U.S. Cl.
CPC .......... *H01L 21/7806* (2013.01); *H01L 22/24* (2013.01); *H01L 23/34* (2013.01); *H01L 25/0753* (2013.01); *G09G 2300/0426* (2013.01); *G09G 2330/12* (2013.01); *H01L 33/30* (2013.01); *H01L 33/32* (2013.01); *H01L 2021/6006* (2013.01)

(58) Field of Classification Search
CPC . H01L 25/0753; H01L 21/7806; H01L 33/30; H01L 33/32; H01L 2021/6006; G01R 31/2635; G01R 31/275
See application file for complete search history.

(56) References Cited

U.S. PATENT DOCUMENTS

| | | | |
|---|---|---|---|
| 2009/0201231 A1 | 8/2009 | Takahara et al. | |
| 2009/0322734 A1* | 12/2009 | Yamamoto | G09G 3/3233 345/214 |
| 2015/0022098 A1* | 1/2015 | Knapp | G09G 3/2003 315/161 |
| 2016/0163745 A1* | 6/2016 | Choi | H01L 27/1251 257/40 |
| 2016/0249432 A1* | 8/2016 | Zhang | G09G 3/3406 |

FOREIGN PATENT DOCUMENTS

| | | |
|---|---|---|
| KR | 2012-0069137 A | 6/2012 |
| KR | 2015-0064545 A | 6/2015 |
| WO | WO 2002/071379 A2 | 9/2002 |
| WO | WO 2017/043216 A1 | 3/2017 |

OTHER PUBLICATIONS

Extended European Search Report, European Application No. 19157357. 5, dated Aug. 1, 2019, 7 pages.

* cited by examiner

TESTING OF MICRO LIGHT EMITTING DIODES (LEDS) USING PROBE PADS

CROSS REFERENCE TO RELATED APPLICATION

This application claims the benefit of Greek Patent Application No. 20180100297, filed Jul. 3, 2018, which is incorporated by reference in its entirety.

BACKGROUND

This disclosure relates to testing operations of light emitting diodes (LEDs) mounted on a substrate, more specifically to testing operations of microLEDs using probe pads embedded in the substrate.

Light emitting devices, such as micro LEDs (µLEDs) are used in electronic display panels to emit light for image production. Such electronic display panels may involve picking up and placing LED dies on a substrate. Each electronic display panel may include a large number of LEDs (e.g., 1280 LEDs for each color). If an LED die contains 20 LEDs of the same color, 64 dies are picked and placed on the substrate of the electronic display panel for each color. After all of the LED dies are placed onto the substrate, each of the LEDs are probed individually to detect whether the LEDs on the electronic display panel turn on.

However, individually probing a large number of the LEDs on the substrate is costly and time consuming. Further, even if the LEDs placed early during a fabrication process are defective or not correctly connected, probing of the LEDs is typically performed after all the LEDs are mounted on the substrate. This may lead to wasted LEDs and assembly time because the substrate with defective LEDs is not identified until all the LEDs are mounted onto the substrate.

SUMMARY

Embodiments relate to testing LEDs by applying a voltage difference between anode electrodes and cathode electrodes of the LEDs through at least two probe pads on a display substrate. The anode electrodes of the LEDs are connected to a first probe pad on the display substrate via first transistors on the display substrate. The cathode electrodes of the LEDs are connected to a second probe pad on the display substrate. During a testing mode, the first probe pad is applied with a first reference voltage, and the second probe pad is applied with a second reference voltage that is lower than the first reference voltage. A voltage difference is applied across the first probe pad connected to the anode electrodes of the LEDs and the second probe pad connected to the cathode electrodes of the LEDs using probes. Responsive to applying the voltage difference that is at least a forward voltage of the LEDs, LEDs that do not turn on are identified as defective LEDs.

Embodiments also relate to a display assembly for operating a light emitting diode in a testing mode and an operating mode. The display assembly includes a plurality of pixels with each pixel including an LED and at least three transistors: a switching transistor, a driving transistor, a clamping transistor. The LED is connected to the transistors via metal bumps and conductive traces on the display substrate.

In one or more embodiments, the switching transistor is used during operating mode and is turned on or off according to a control signal applied to a gate of the switching transistor. The switching transistor receives a pulse width modulation (PWM) signal for display of its corresponding pixel. When the pulse width modulation signal applies a high voltage to the gate of the switching transistor, a display current flows through the switching transistor and the driving transistor. The switching transistor is inactive during the testing mode.

In one or more embodiments, the driving transistor generates a bias current to turn its corresponding LED on during the operating mode and is inactive during the testing mode. The driving transistor is connected to a current mirror signal source, and the current mirror signal source controls the bias current through the plurality of driving transistors that is used to turn the LED on during the operating mode.

In one or more embodiments, the circuit also includes a plurality of clamping transistors that connects anode electrodes of the LEDs to the first probe pad and prevents voltages at the anode electrodes of the LEDs from dropping below a minimum voltage during the operating mode. The drain terminals and gate terminals of the plurality of clamping transistors are connected to the anode electrodes of the LEDs, and the source terminals of the clamping transistors are connected to a first probe pad that receives a first reference voltage via a first probe during the testing mode.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

Embodiments relate to testing LEDs on a display substrate by providing current to electronic components (e.g., transistors) via probe pads and conductive traces on the display substrate, in a testing mode. The conductive traces are connected to the probe pads that come in contact with probes. During the testing mode, defective LEDs may be identified by applying current through the probe pads and determining whether the LEDs meet a threshold of operability. In an operational mode, the probe pads disengage from the probes, and the LEDs are operated using different electronic components (e.g., transistors) in the display substrate.

Figure 1A:
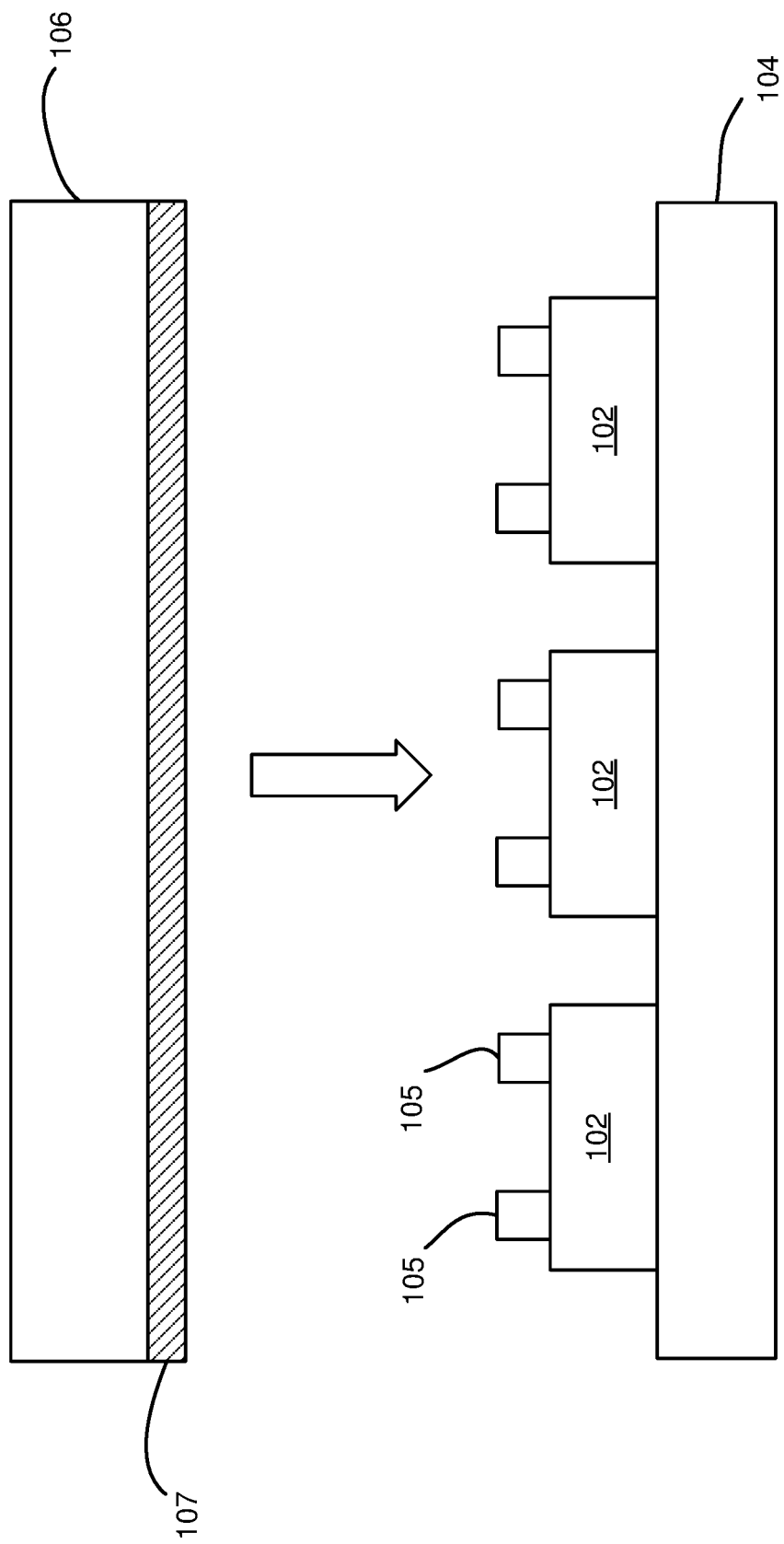
FIG. 1A illustrates a carrier substrate picking up LEDs on a fabrication substrate, in accordance with an embodiment.

FIG. 1A illustrates a carrier substrate 106 picking up LEDs 102 on a fabrication substrate 104, in accordance with an embodiment. The LEDs 102 may be fabricated by growing various layers of material on the fabrication substrate 104 using methods such as chemical vapor deposition (CVD). The LEDs 102 on the fabrication substrate emit light of the same color, which may be one of red, blue, or green color. The LEDs 102 may be made of gallium nitride (GaN), gallium arsenide (GaAs), or gallium phosphide (GaP), depending on the color of light emitted by the LEDs 102. Each LED 102 includes electrodes 105 some of which may be anode electrodes while others are cathode electrodes. LEDs 102 may also have an individual p-electrode but share an n-electrode through the body of the LED 102 or vice versa.

The carrier substrate 106 may have an adhesive layer 107 that picks up the LEDs 102 from the fabrication substrate 104. After the LEDs 102 are attached to the adhesive layer 107 of the carrier substrate 106, the fabrication substrate 104 is removed from the LEDs 102 by a laser lift off (LLO) process. Instead of or in addition to the LLO process, the fabrication substrate 104 may be treated with an etching medium to separate the fabrication substrate 104 from the LEDs 102. The carrier substrate 106 provides structural support to the LEDs 102 once the fabrication substrate 104 is removed.

Figure 1B:
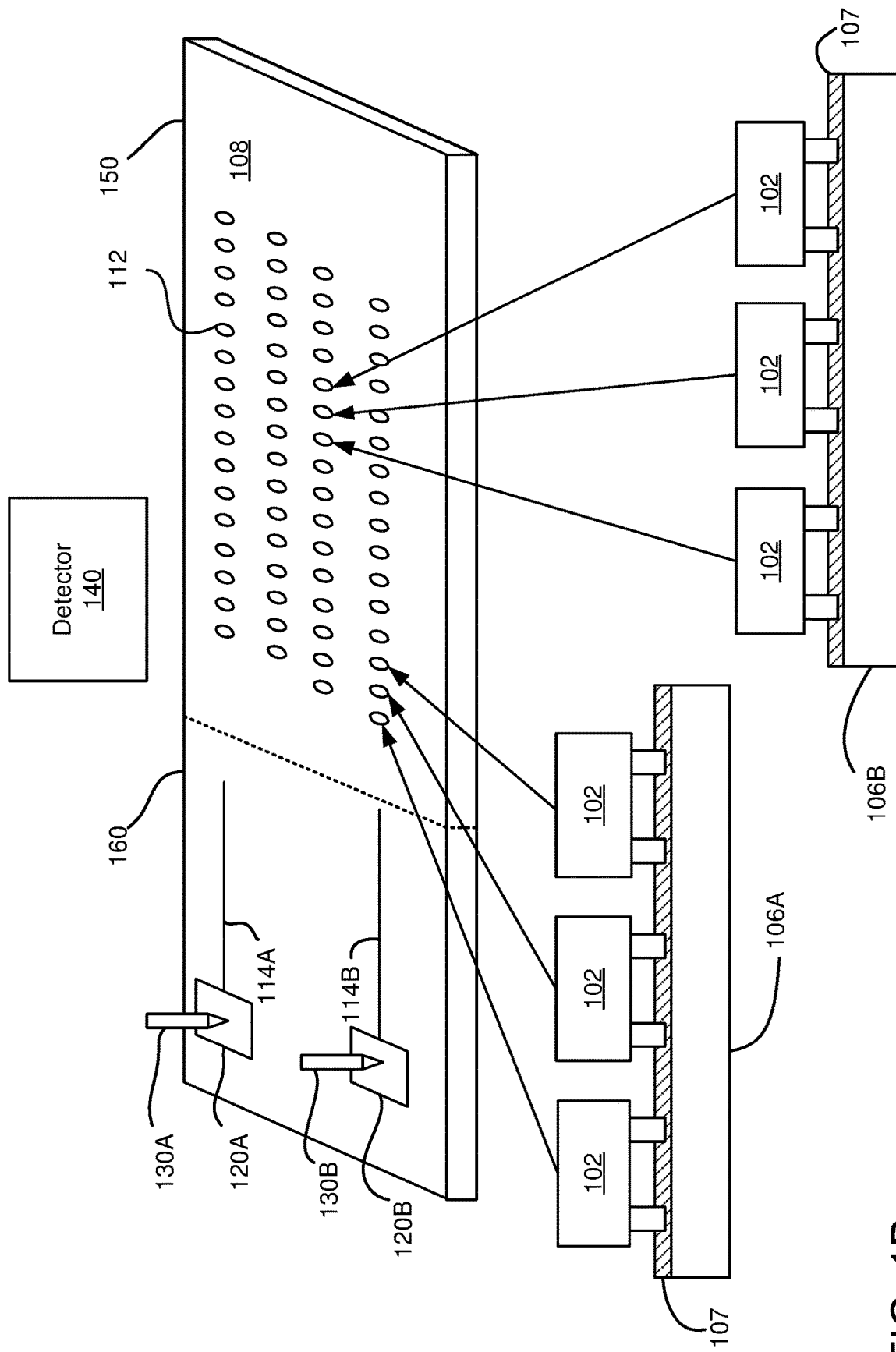
FIG. 1B illustrates the LEDs placed on a display substrate, in accordance with an embodiment.

FIG. 1B illustrates placing of the LEDs 102 on a display substrate 108, in accordance with an embodiment. Each of the carrier substrates 106A, 106B (hereinafter collectively referred to as "carrier substrates 106") carries a plurality of LEDs 102. In one embodiment, carrier substrate 106A may carry LEDs 102 that emit light of one color, and carrier substrate 106B may carry LEDs 102 that emit light of another color. In other embodiments, carrier substrates 106A, 106B may carry LEDs 102 that emit the same color. In other embodiments, there may be additional carrier substrates with LEDs 102 that emit light of yet another color. Although not shown in FIG. 1B, there may be additional carrier substrates with additional LEDs 102 to be placed on the display substrate 108. Each carrier substrate may carry a fixed number of LEDs 102 (e.g., 20 or 40 LEDs per carrier substrate).

The LEDs 102 are picked from the carrier substrates 106 and placed on the display substrate 108. The transfer of the LEDs from the carrier substrates 106 may be conducted using a pick-up tool (not shown) that detaches the LEDs from the carrier substrates 106 and dropping onto the display substrate 108. The LEDs 102 may be attached to the carrier substrates 106 through an adhesive layer 107. In some embodiments, the LEDs 102 are removed from the adhesive layer 107 of the carrier substrates 106 with a solvent. In other embodiments, the adhesive force of the adhesive layer 107 of the carrier substrates 106 is weak enough that the LEDs 102 may be picked using force without damaging the LEDs 102.

The display substrate 108 may operate in an operating mode and a testing mode. During the operating mode, LEDs 102 are operated using a driving circuit (not shown) on the display substrate 108 that includes a current source (e.g., current source 270) and a plurality of pulse width modulation generators (e.g., PWM generator 260). During the testing mode, the driving circuit is not used and current is applied to the LEDs 102 through test probes instead (e.g., first probe 130A and second probe 130B).

The driving circuit powers and drives the LEDs 102 through conductive traces (not shown) on the display substrate 108 during the operating mode. The display substrate 108 may have a display portion 150 and a non-display portion 160. The display portion 150 may include the LEDs 102 and transistors (not shown) that connect the LEDs 102 to the driving circuit and probe pads 120A and 120B, and the non-display portion 160 may include the driving circuit and a pad region that includes the probe pads 120A and 120B.

The metal bumps 112 are used for connecting to electrodes of LEDs 102 to provide current to the LEDs 102. The metal bumps 112 may be made of conductive material such as copper, copper alloys, and silver. A first subset of the metal bumps 112 are connected to anode electrodes of the LEDs 102 via a set of traces, and a second subset of the metal bumps 112 are connected to cathode electrodes of the LEDs 102 via another set of traces. In some embodiments, the electrodes may be connected to the metal bumps 112 on the display substrate 108 by thermocompression (TC) bonding. The metal bumps 112 are contact points between electrodes of the LEDs 102 and traces that extend on or in the display substrate 108.

Similar to metal bumps 112, the traces may be made of conductive material such as copper, copper alloys, and silver, and may be printed on the display substrate 108. The traces may be printed on the display substrate 108 and provide electrical connection between two or more components on the display substrates 108. For example, the traces 114A and 114B electrically connect the LEDs 102 to the probe pads 120A and 120B. As described below in detail with reference to FIG. 2, when the probe pads 120A and 120B are applied with voltages, the LEDs 102 may be turned on if voltage between the cathode electrodes and the anode electrodes of the LEDs 102 is greater than a forward voltage of the LEDs 102.

The probe pads 120A, 120B are conductive pads on the display substrate 108 that come in contact with test probes 130A, 130B. The probe pads 120A, 120B may be made of a conductive material such as copper, copper alloys, and silver. In the example shown in FIG. 1B, there is one set of two probe pads (e.g., probe pads 120A, 120B), but in other embodiments, there may be additional probe pads on the display substrate 108. The probe pads 120 may be located anywhere on the non-display portion 160 of the display substrate 108.

In one example, a first probe pad 120A is applied with a first reference voltage via a first probe 130A and a second probe pad 120B is applied with a second reference voltage via a second probe 130B during the testing mode. The first probe pad 120A may be connected to the anode electrodes of the LEDs 102, and the second probe pad 120B may be connected to the cathode electrodes of the LEDs 102 via the conductive traces 114A, 114B. The first reference voltage may be higher than the second reference voltage such that the difference in voltage between the first reference voltage and the second reference voltage is at least the forward voltage of the LEDs 102.

When the LEDs 102 all have a single color, the LEDs 102 have a same forward voltage and may be tested using only two probe pads (e.g., probe pads 130A and 130B). However, when the LEDs 102 include more than one color, additional probe pads are used such that there is at least a separate probe pad for anode electrodes of LEDs 102 of each of the different colors. Cathode electrodes of the LEDs 102 may be connected to a same probe pad even though the LEDs 102 include more than one color. However, to apply a different forward voltage for each of the different colors, anode electrodes of the LEDs 102 may be connected to multiple probe pads according to color.

In the testing mode, a detector 140 detects whether the LEDs 102 are operable. The detector 140 may be a photodetector or an imaging device (e.g., camera) that uses image detection algorithms to determine which LEDs 102 on the display substrate 108 satisfy a threshold level of operability. After each pick-and-place of LEDs 102 from the carrier substrates 106A, 106B onto the display substrate 108, the LEDs 102 may be tested for defects. The threshold level of operability may be that the LEDs 102 turn on or that the brightness of the turned on LEDs 102 is above a threshold. The detector 140 may identify the position of the LEDs 102 on the display substrate 108 that do not satisfy the threshold level of operability (e.g., defective LEDs) so that the entire display substrate 108 may be discarded, or the defective LEDs may be removed or compensated for during the operating mode.

Figure 2:
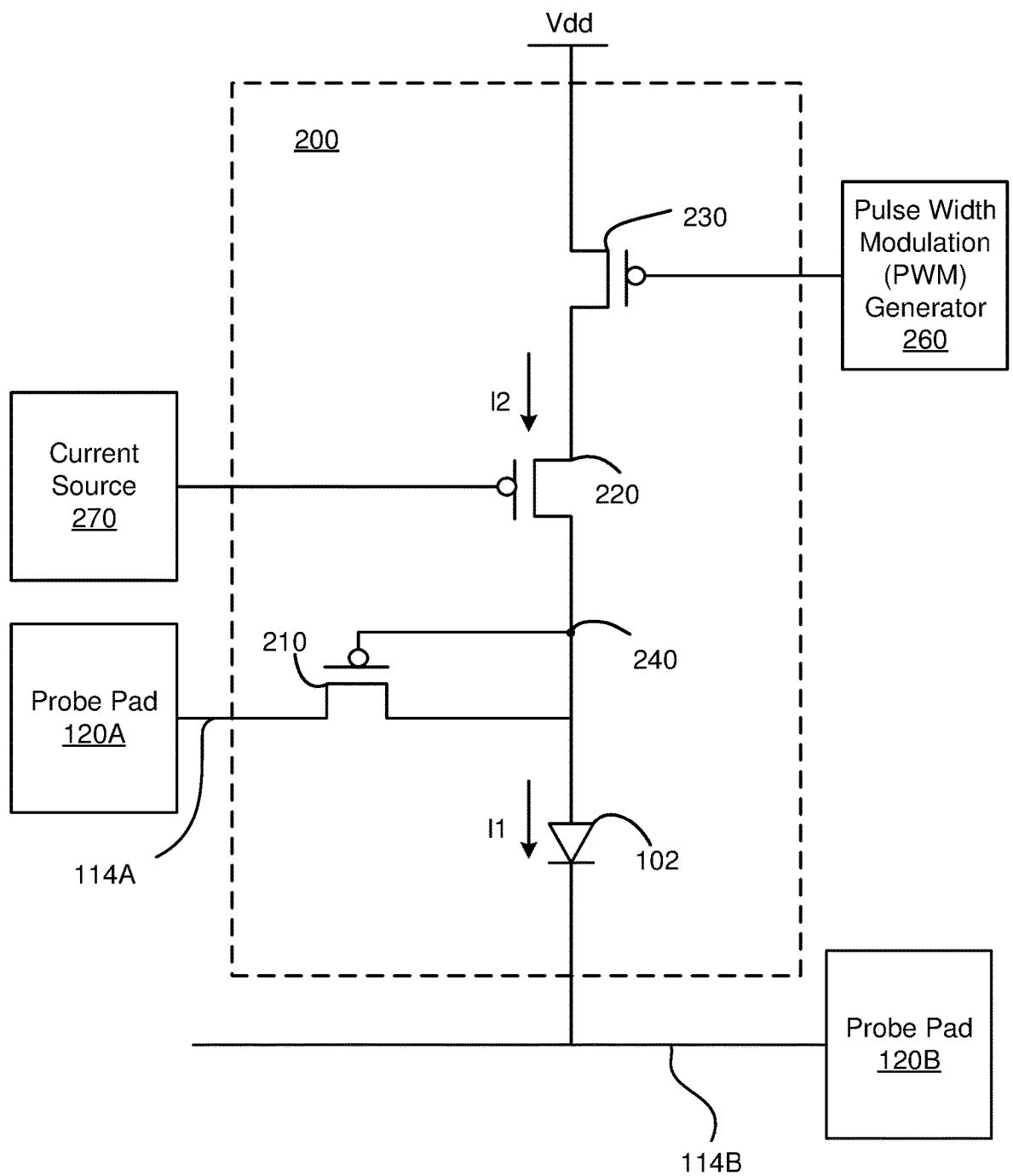
FIG. 2 illustrates a circuit of a pixel of a display substrate, in accordance with an embodiment.

FIG. 2 illustrates a circuit of a pixel 200 of a display substrate 108, in accordance with an embodiment. The pixel 200 includes a first transistor 210, a second transistor 220, and a third transistor 230 connected to a LED 102. The first transistor 210, the second transistor 220, and the third transistor 230 may be embedded in the display substrate 108 and electrically connected to the LEDs 102 via traces that are printed on the display substrate 108. In pixel 200, the transistors operate in a different manner or selectively enabled during the testing mode and the operating mode. Specifically, during the testing mode, the first transistor 210 is turned on to provide current to the LED 102 but the second transistor 220 and the third transistor 230 are turned off. During the operating mode, the first transistor 210 functions as a clamping transistor while the second transistor 220 and the third transistor 230 are used to control the operation of the LED 102.

In the example shown in FIG. 2, the first transistor 210, the second transistor 220, and the third transistor 230 are p-channel MOSFETs. However, different types of transistors may be used (e.g., n-channel MOSFETs). The electrodes of the LED 102 are fixed to the display substrate 108 via metal bumps (e.g., metal bumps 112) that are connected to traces on the display substrate 108. The traces also connect the transistors and LED 102 to other circuit elements on the display substrate 108 such as a supply voltage Vdd, a pulse width modulation (PWM) generator 260, and a current source 270 that are part of a driving circuit used to turn the LED 102 on during the operating mode. The display substrate 108 may have a display portion and a non-display portion. The PWM generator 260 and the current source 270 may be in the non-display portion 160 and connected to the pixel 200 in the display portion 150 through the traces.

The first transistor 210 may be a clamping transistor that supplies a first reference voltage to an anode electrode of the LED 102 during the testing mode. A source terminal of the first transistor 210 is connected to the first probe pad 120A, and a gate terminal and a drain terminal of the first transistor 210 are both connected to an anode electrode of the LED 102 at a node 240. The cathode electrode of the LED 102 is connected to the second probe pad 120B. During the testing mode, a bias current I1 that turns the LED 102 on is supplied by a probe (e.g., first probe 130A) that comes into contact with the probe pad 120A. Because the second transistor 220 and the third transistor 230 are inactive during the testing mode, there is no display current I2 flowing through the second transistor 220 and the third transistor 230, and the bias current I1 is controlled by the first transistor 210. During the operating mode, the first transistor 210 is used to prevent the voltage at the node 240 (where the gate terminal and the drain terminal of the first transistor 210 meet the anode electrode of the LED 102 and the drain terminal of the second transistor 210) from dropping lower than a threshold voltage (e.g., −1V). During the operating mode, the probe pad 120A may be connected to a DC voltage source to clamp the voltage at the node 240. Without the first transistor 210, the voltage at the node 240 may drop lower than the threshold voltage which leads to breakdown of the LED 102.

The difference between the first reference voltage and the second reference voltage may depend on the color of the LED 102. For example, for testing blue and green LEDs, the first probe may apply the first reference voltage of −1V and apply the second reference voltage of −4V such that the voltage difference is 3V. For red LEDs, the first probe may apply the first reference voltage of −1V and applies the second reference voltage of −3V such that the voltage difference is 2V, different from the voltage difference for testing blue and green LEDs. The first reference voltage and the second reference voltage may apply voltage of different values than the values mentioned above. However, the voltage difference between the first reference voltage and the second reference voltage is at least the forward voltage of the LED across which the voltage difference is applied. For example, to test the red LEDs, the first probe pad 120A may instead be applied with a first reference voltage of 2V and the second probe pad 120B may be applied with a second reference voltage 0V, but the voltage difference between the two reference voltages is still 2V.

The second transistor 220 is a driving transistor that supplies a bias current I1 to the LED 102 during the operating mode. The drain terminal of the second transistor 220 is connected to the anode terminal of the LED 102 and the gate and drain terminals of the first transistor 210 at the node 240. During the operating mode, the first transistor 210 may be inactive, and the bias current I1 is controlled by the second transistor 220. The second transistor 220 controls a display current I2 that flows through the third transistor 230 and the second transistor 220. During the operating mode, the bias current I1 is controlled by the display current I2. The bias current I1 applied to the LED 102 during the operating mode may be greater than during the testing mode because the LED 102 in the operating mode is brighter to produce better image quality whereas only a lower threshold brightness has to be satisfied to identify that the LED 102 is turned on.

The gate of the second transistor 220 is connected to a current source 270. The current source 270 may include a current mirror circuit that supplies a bias current I1 to the LED 102 during the operating mode. The current source 270 supplies the bias current I1 to the LED 102 of pixel 200 shown in FIG. 2 as well as other LEDs (not shown) on a same substrate as the pixel 200. The current source 270 enables the bias current I1 through the second transistor 220 to be controlled by the current source 270.

The third transistor 230 is a switch transistor controlled by pulse signals from a pulse width modulation (PWM) generator 260 during the operation mode. The pulse signals may be a square pulse that alternates between a high voltage and a low voltage with a certain duty cycle. By controlling the duty pulse, the brightness of the LED 102 in the pixel 200 can be controlled. When the pulse signals apply a high voltage at a gate terminal of the third transistor 230, the third transistor 230 switches on and conducts electricity between a source terminal connected to the supply voltage Vdd and a drain terminal connected to the second transistor 220. A display current I2 flows through the third transistor 230, and into the source terminal of the second transistor 220.

Figure 3A:
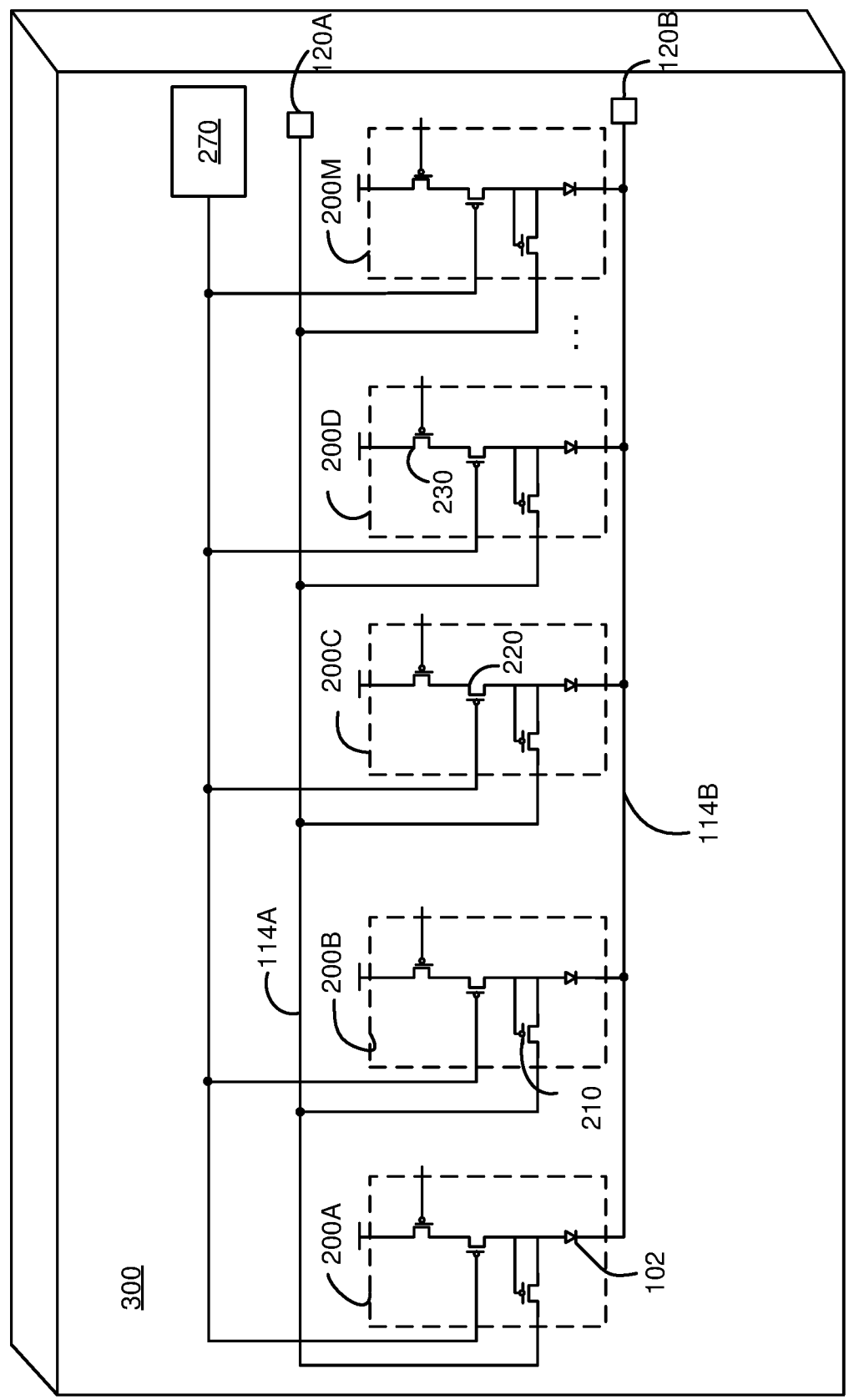
FIGS. 3A and. 3B are example schematic diagrams of a display substrate with probe pads, in accordance with an embodiment.
Figure 3B:
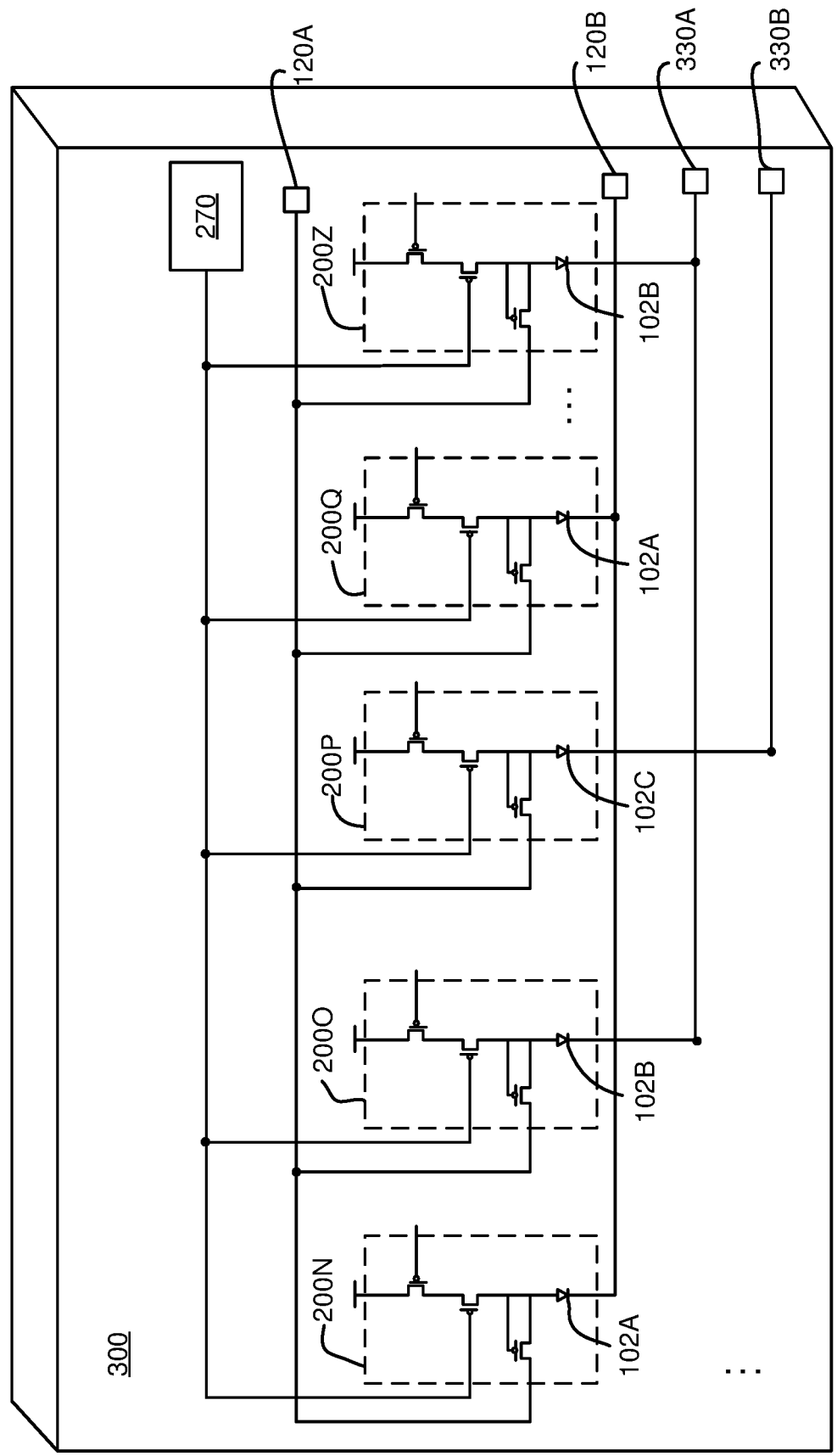

FIGS. 3A and 3B are schematic diagrams of a display substrate with probe pads, in accordance with an embodiment. In FIG. 3A, the display substrate 300 includes a plurality of pixels 200A-200M arranged in an array. Each of pixels 200A-200M includes first transistors 210, second transistors 220, third transistors 230, and LEDs 102, as described above with reference to FIG. 2. In the example shown in FIG. 3A, pixels 200A-200M is shown in a single row for the sake of convenience. In practice, however, pixels 200A-200M may be arranged in multiple rows and columns in an array structure.

Each of the first transistors 210 in pixels 200A-200M is connected to a first trace 114A that is, in turn, connected to a first probe pad 120A. Each of the first transistors 210 connects anode electrodes of the LEDs 102 to the first probe pad 120A. Each of the cathode electrodes of the LEDs 102 in the pixels 200A-200M is connected to a second probe pad 120B via a second trace 114B. In the example shown in FIG. 3A, all of the LEDs 102 are LEDs of a same color. Because the LEDs 102 are of the same color, the LEDs 102 have the same forward voltage. As a result, these LEDs 102 may be tested at the same time by applying the same voltage difference across the electrodes of the LEDS 102. During the testing mode, a first probe is brought into contact with the first probe pad 120A, and a second probe is brought into contact with the second probe pad 120B. When the first reference voltage and the second reference voltage are applied via the test probes, defective LEDs or defective connections to LEDs may not satisfy the threshold level of operability (e.g., not turn on at all, may flicker, or may be dim). By detecting the threshold level of operability after applying the reference voltages, the defective LEDs or defective connections to LEDs may be identified.

In some embodiments, additional second probe pads 120B may be provided to connect to a subset of the LEDs 102. For example, one of the additional second probe pads 120B may be connected to cathode electrodes of LEDs 102 in even rows while another of the additional second probe pads 120B is connected to cathode electrodes of LEDs in odd rows. The second probe pad 120B that an LED 102 connects to may also be based on a position of the LED within a row. When there are more second probe pads 120B, it is easier to drain the current from the display substrate 300.

In some embodiments, the first probe functions as a current source that supplies a low current to the LEDs 102. When an LED is shorted, some of the current may be directed to the shorted LED, but the rest of the current flows through the rest of the LEDs, and the rest of the LEDs may turn on despite the shorted LED. The current source prevents a shorted LED among the LEDs 102 from drawing the entire current, which may happen if a voltage source is used instead of the current source. When a voltage source is used, the shorted LED may preventing the rest of the LEDs 102 from getting current by drawing all the current. When the rest of the LEDs 102 do not receive current, these remaining LEDs 120 do not turn on, which may lead to incorrect identification of defective LEDs. Instead of identifying the single defective shorted LED, the entire row of LED connected to the probe pad may incorrectly be identified as defective LEDs.

In FIG. 3B, the display substrate 300 includes a plurality of pixels 200N-200Z, the plurality of pixels 200N-200Z including first LEDs 102A, second LEDs 102B, and third LEDs 102C of different colors. For example, first LEDs 102A may emit a first color (e.g., red), second LEDs 102B may emit a second color (e.g., green), and third LEDs 102C may emit a third color (e.g., blue).

In some embodiments, cathode electrodes of the first LEDs 102A are connected to probe pad 120B, cathode electrodes of the second LEDs 102B are connected to a second probe pad 330A, and cathode electrodes of the third LEDs 102C are connected to a third probe pad 330B. Anode electrodes of the first LEDs 102A, second LEDs 102B, and third LEDs 102C are all connected to probe pad 120A. During a testing mode, a pair of probe pads may be applied with reference voltages to test the LEDs by color. For example, to test LEDs of the first color (e.g., red), a test probe makes contact with probe pad 120A and applies a first reference voltage (i.e., high voltage), and another probe makes contact with the first probe pad 120B and applies a second reference voltage (i.e., low voltage). The first reference voltage is higher than the second reference voltage by at least a forward voltage of the first LEDs 102A. To test LEDs of the second color (e.g., green) and the third color (e.g., blue), two other probes make contact with probe pads 330A, 330B to apply the third and fourth reference voltages to the LEDs 102B, 102C. The second, third and fourth reference voltage (i.e., low voltages) may be of different levels suitable for testing respective LEDs 102A, 102B, 102C.

In the embodiment of FIG. 3B, four probe pads 120A, 120B, 330A, 330B are used to test three different types of LEDs. However, additional probe pads may be used to accommodate the drain current, test additional types of LEDs or test other characteristics of the LEDs.

Figure 4:
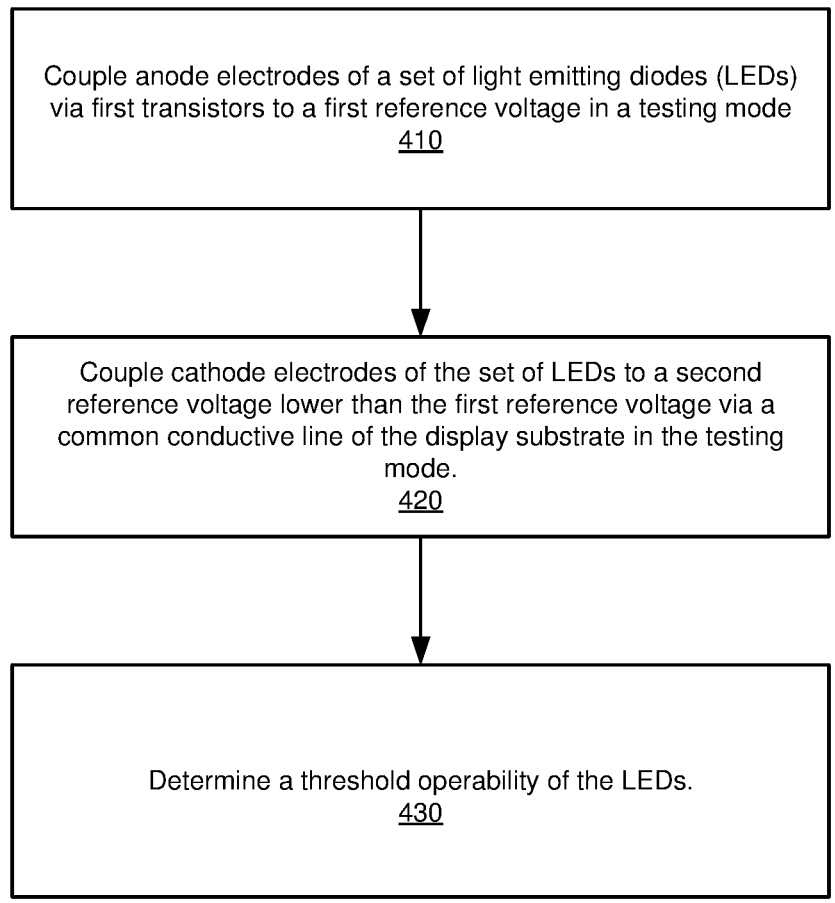
FIG. 4 is a flowchart illustrating the process of testing LEDs, in accordance with an embodiment.

FIG. 4 is a flowchart illustrating the process of testing LEDs, in accordance with an embodiment. The anode electrodes of a set of light emitting diodes (LEDs) are coupled 410 via first transistors to a first reference voltage in a testing mode. The first transistors is mounted on a display substrate subject to the test. The anode electrodes of the LEDs are connected to gate terminals and drain terminals of the first transistors, and source terminals of the first transistors are connected to a first probe pad.

The cathode electrodes of the set of LEDs are coupled 420 to a second reference voltage lower than the first reference voltage via a common conductive line of the display substrate in the testing mode. The cathode electrodes of the set of LEDs are connected to a second probe pad through the common conductive line. During the testing mode, a first probe makes contact with the first probe pad and applies the first probe pad with the first reference voltage. Similarly, a second probe makes contact with the second probe pad, and applies the second probe pad with the second reference voltage, the second reference voltage lower than the first reference voltage by at least a forward voltage of the set of LEDs.

After coupling the anode electrodes to the first reference voltage and the cathode electrodes to the second reference voltage, a threshold operability of the LEDs is determined 430. In some embodiments, a detector captures an image or a video of the display substrate while first reference voltage and the second reference voltage are applied to the respective probe pads. The image or video may be analyzed to identify defective LEDs among the set of LEDs.

Figure 5:
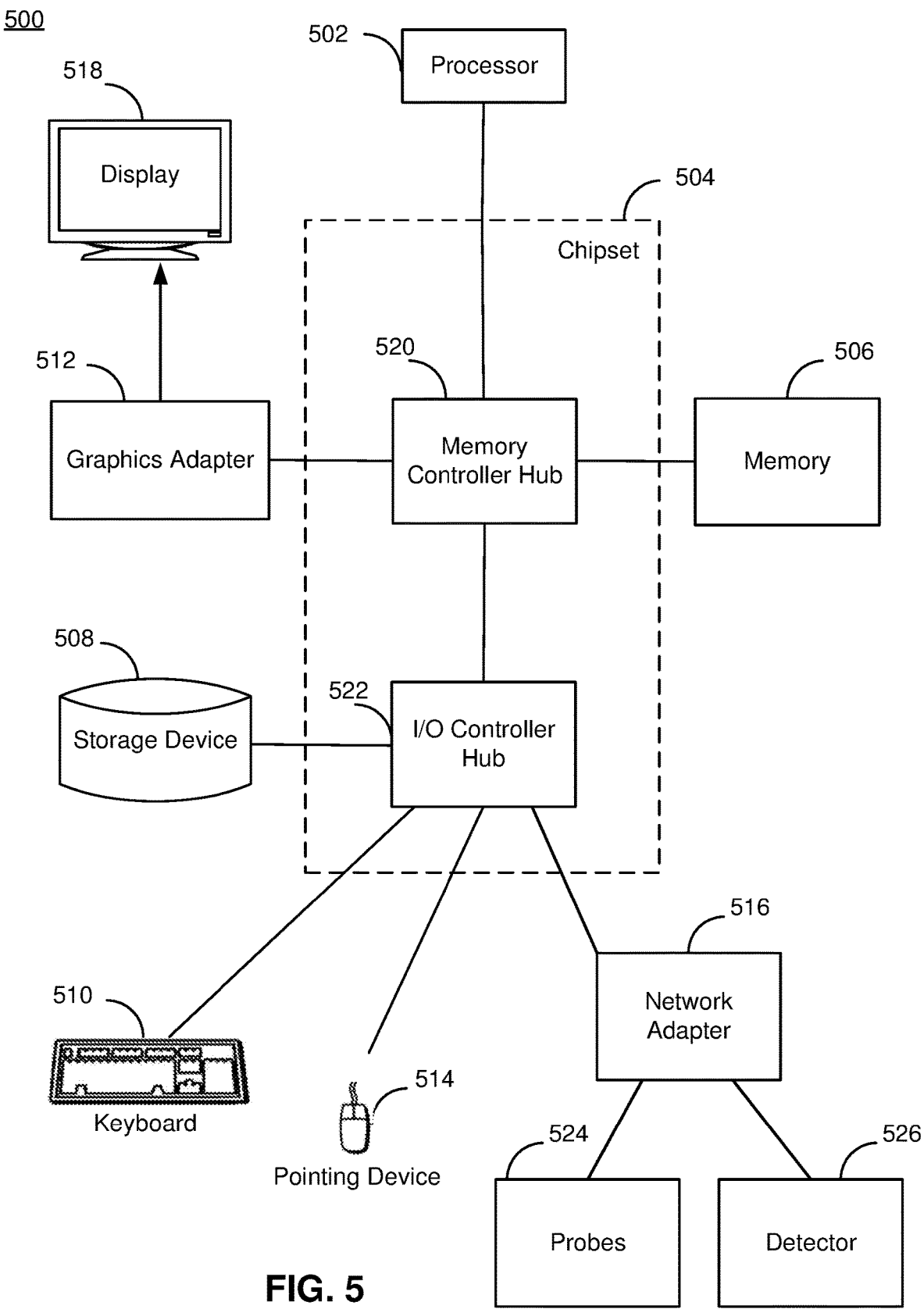
FIG. 5 is a block diagram illustrating a computing system for use in the LEDs testing system, in accordance with an embodiment.

FIG. 5 is a block diagram illustrating a computing system for use in the LEDs testing system, in accordance with an embodiment. The computer system 500 may be used to perform the processes described above with reference to FIG. 4. Illustrated in FIG. 5 are at least one processor 502 coupled to a chipset 504. The chipset 504 includes a memory controller hub 520 and an input/output (I/O) controller hub 522. A memory 506 and a graphics adapter 512 are coupled to the memory controller hub 520, and a display device 518 is coupled to the graphics adapter 512. A detector 130, storage device 508, keyboard 510, pointing device 514, and network adapter 516 are coupled to the I/O controller hub 522. Other embodiments of the computer 500 have different architectures. For example, the memory 506 is directly coupled to the processor 502 in some embodiments.

The storage device 508 includes one or more non-transitory computer-readable storage media such as a hard drive, compact disk read-only memory (CD-ROM), DVD, or a solid-state memory device. The memory 506 holds instructions and data used by the processor 502. For example, the memory 506 may store instructions that when executed by the processor 502, configures the processor to perform the method 400. The pointing device 514 is used in combination with the keyboard 510 to input data into the computer system 500. The graphics adapter 512 displays images and other information on the display device 518. In some embodiments, the display device 518 includes a touch screen capability for receiving user input and selections. The network adapter 516 couples the computer system 500 to a network that controls, for example, operating probes 524 for applying reference voltages and a detector 526 for capturing an image of the display assembly to identify defective LEDs on the display assembly. The network may specify the reference voltages to apply to particular probe pads on the display assembly and apply the reference voltages via the probes 524 to the probe pads. After applying the reference voltages, the detector 526 may capture an image or a video to determine whether there are defective LEDs. Although not shown in FIG. 5, the network adaptor 516 may also be coupled to a network that is configured to remove/replace the defective LEDs or compensate for the defective LEDs. Some embodiments of the computer 500 have different and/or other components than those shown in FIG. 5.

The computer 500 is adapted to execute computer program modules for providing functionality described herein. As used herein, the term "module" refers to computer program instructions and/or other logic used to provide the specified functionality. Thus, a module can be implemented in hardware, firmware, and/or software. In one embodiment, program modules formed of executable computer program instructions are stored on the storage device 508, loaded into the memory 506, and executed by the processor 502. For example, program instructions for the method describe herein can be stored on the storage device 508, loaded into the memory 506, and executed by the processor 502.

The language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method comprising:
coupling anode electrodes of a set of light emitting diodes (LEDs) via first transistors to a first reference voltage in a testing mode, the first transistors on a display substrate on which the LEDs are mounted;
coupling cathode electrodes of the set of LEDs to a second reference voltage lower than the first reference voltage via a common conductive line of the display substrate in the testing mode; and
responsive to coupling the anode electrodes to the first reference voltage and the cathode electrodes to the second reference voltage, determining a threshold operability of the LEDs.

2. The method of claim 1, wherein the first transistors are configured to clamp an operating voltage of the anode electrodes of the set of LEDs in an operating mode.

3. The method of claim 2, wherein drain terminals and gate terminals of the first transistors are connected to the anode electrodes of the LEDs, and source terminals of the first transistors are connected to the first reference voltage in the testing mode.

4. The method of claim 3, wherein each of the anode electrodes of the LEDs is connected to a second transistor and a third transistor in series, the second transistor having a gate receiving a current from a current source common across a plurality of second transistors connected to the anode electrodes of the LEDs in the operating mode, and the third transistor having a gate receiving a pulse width modulation (PWM) signal in the operating mode.

5. The method of claim 3, wherein determining the threshold operability comprises:
capturing an image of the set of LEDs by a detector; and
determining turning on of each of the LEDs by analyzing the captured image.

6. The method of claim 1, further comprising moving the set of LEDs from one or more fabrication substrate onto the display substrate prior to coupling the anode electrodes and the cathode electrodes.

7. The method of claim 1, wherein coupling the anode electrodes to the first reference voltage comprises contacting a first probe with a probe pad connected to another common conductive line extending to the anode electrodes.

8. The method of claim 7, wherein coupling the cathode electrodes to the second reference voltage comprises contacting a second probe with another probe pad connected to the common conductive line.

9. The method of claim 1, further comprising:
coupling anode electrodes of another set of light emitting diodes (LEDs) to the first reference voltage in the testing mode; and
coupling cathode electrodes of the other set of LEDs to a third reference voltage lower than the first reference voltage via another common conductive line of the display substrate in the testing mode.

10. A display assembly comprising:
a plurality of switching transistors configured to turn on or turn off responsive to receiving control signals at gates of the switching transistors in an operating mode, the switching transistors configured to be inactive during a testing mode;
a plurality of clamping transistors via which a voltage difference between anode electrodes and cathode electrodes of light emitting diodes (LEDs) is applied in the testing mode, the clamping transistors configured to clamp the anode electrodes to an operating voltage in the operating mode; and
a plurality of driving transistors between the switching transistors and the anode electrodes of the LEDs to generate a bias current for the plurality of LEDs during the operating mode, the driving transistors configured to be inactive during the testing mode.

11. The display assembly of claim 10, wherein drain terminals and gate terminals of the clamping transistors are connected to the anode electrodes of the LEDs, and source terminals of the clamping transistors are connected to a first reference voltage in the testing mode.

12. The display assembly of claim 11, wherein each of the anode electrodes of the LEDs is connected to one of the plurality of driving transistors and one of the plurality of switching transistors in series, the one of the plurality of driving transistors having a gate receiving a current mirror signal common across the plurality of driving transistors connected to the anode electrodes of the LEDs in the operating mode, and the one of the plurality of switching transistors having a gate receiving a pulse width modulation (PWM) signal in the operating mode.

13. The display assembly of claim 11, further comprising:
a first probe pad coupled to source terminals of a first portion of the plurality of clamping transistors, the first probe pad configured to receive the first reference voltage from a first probe during the testing mode;
a second probe pad coupled to the cathode electrodes of at least a first portion of the LEDs, the second probe pad configured to receive a second reference voltage from a second probe during the testing mode, wherein the second reference voltage is lower than the first reference voltage.

14. The display assembly of claim 13, wherein one or more LEDs are discarded responsive to detecting that the one or more LEDs of the first portion of the LEDs are not turned on responsive to applying the first reference voltage and the second reference voltage in the testing mode.

15. The display assembly of claim 13, wherein the first portion of the LEDs has a first color.

16. The display assembly of claim 15 further comprising:
a third probe pad coupled to a second portion of the LEDs, the third probe pad configured to receive a third reference voltage from a third probe during the testing mode, wherein the third reference voltage has a different voltage value from the second reference voltage.

17. The display assembly of claim 16, wherein the second portion of the LEDs has a second color different from the first color.

18. The display assembly of claim 16, wherein the first portion of the LEDs are arranged on a first row on the display assembly and the second portion of the LEDs are arranged on a second row on the display assembly.

19. The display assembly of claim 11 further comprising a driving circuit configured to power the display assembly during an operating mode, the driving circuit connected to the LEDs via the switching transistors and the driving transistors.

20. A non-transitory computer readable storage medium storing instructions thereon, the instructions when executed by a processor cause the processor to:
couple anode electrodes of a set of light emitting diodes (LEDs) via first transistors to a first reference voltage in a testing mode, the transistors of a display substrate on which the LEDs are mounted;
couple cathode electrodes of the set of LEDs to a second reference voltage lower than the first reference voltage via a common conductive line of the display substrate in the testing mode; and
responsive to coupling the anode electrodes to the first reference voltage and the cathode electrodes to the second reference voltage, determine a threshold operability of the LEDs.

* * * * *